US011930720B2

(12) United States Patent
Yang et al.

(10) Patent No.: US 11,930,720 B2
(45) Date of Patent: Mar. 12, 2024

(54) VOLTAGE CONTROL OF SOT-MRAM FOR DETERMINISTIC WRITING

(71) Applicant: INSTITUTE OF MICROELECTRONICS, CHINESE ACADEMY OF SCIENCES, Beijing (CN)

(72) Inventors: Meiyin Yang, Beijing (CN); Jun Luo, Beijing (CN); Yan Cui, Beijing (CN); Jing Xu, Beijing (CN)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 244 days.

(21) Appl. No.: 17/495,390

(22) Filed: Oct. 6, 2021

(65) Prior Publication Data
US 2022/0352460 A1 Nov. 3, 2022

(30) Foreign Application Priority Data
Apr. 28, 2021 (CN) .......................... 202110467444.6

(51) Int. Cl.
*G11C 11/16* (2006.01)
*G11C 11/18* (2006.01)
(Continued)

(52) U.S. Cl.
CPC ........... *H10N 52/80* (2023.02); *G11C 11/161* (2013.01); *G11C 11/1673* (2013.01);
(Continued)

(58) Field of Classification Search
CPC .............. G11C 11/161; G11C 11/1673; G11C 11/1675; G11C 11/18; G11C 11/22; G11C 11/1659; H10B 61/00
See application file for complete search history.

(56) References Cited

U.S. PATENT DOCUMENTS

2014/0321199 A1* 10/2014 Han ...................... G11C 11/161
365/158
2018/0358542 A1* 12/2018 Mihajlovic ......... G11C 11/1673
(Continued)

FOREIGN PATENT DOCUMENTS

CN 102683581 A * 9/2012 ............. G11C 11/16
CN 112635658 A 4/2021

*Primary Examiner* — Mushfique Siddique
(74) *Attorney, Agent, or Firm* — Scully, Scott, Murphy & presser, P.C.

(57) ABSTRACT

The present disclosure provides a storage unit, a data writing method and a data reading method thereof, a memory and an electronic device. The storage unit includes a semiconductor substrate, a first insulating medium layer, a ferroelectric thin film layer, a bottom electrode, a tunnel junction, a first metal interconnection portion, a second metal interconnection portion, a third metal interconnection portion and a fourth metal interconnection portion. The first insulating medium layer is formed on the semiconductor substrate, the ferroelectric thin film layer is disposed on the first insulating medium layer, the bottom electrode is formed on the ferroelectric thin film layer, and the tunnel junction is formed on the bottom electrode. The first metal interconnection portion is connected to a first end of the bottom electrode, and the third metal interconnection portion is connected to a second end of the bottom electrode. The second metal interconnection portion is connected to the ferroelectric thin film layer, and the fourth metal interconnection portion is connected to the tunnel junction. As compared with the prior art, the present disclosure can control a directional flipping of the magnetic moment in the tunnel junction based on the ferroelectric thin film layer provided. Based on the structural design of the storage unit, the present disclosure does not require an external magnetic field, and fully meets the requirement of high integration of the device.

19 Claims, 3 Drawing Sheets

(51) Int. Cl.
*G11C 11/22* (2006.01)
*H10B 61/00* (2023.01)
*H10N 52/00* (2023.01)
*H10N 52/80* (2023.01)

(52) U.S. Cl.
CPC .......... *G11C 11/1675* (2013.01); *G11C 11/18* (2013.01); *G11C 11/22* (2013.01); *H10B 61/00* (2023.02); *H10N 52/00* (2023.02); *G11C 11/1659* (2013.01)

(56) References Cited

U.S. PATENT DOCUMENTS

| | | | |
|---|---|---|---|
| 2019/0386202 A1* | 12/2019 | Gosavi | H10N 50/10 |
| 2020/0098410 A1* | 3/2020 | Gosavi | G11C 11/1675 |
| 2020/0211609 A1* | 7/2020 | Wang | G11C 11/161 |
| 2021/0074344 A1* | 3/2021 | Hu | G11C 11/1675 |
| 2023/0133622 A1* | 5/2023 | Song | G11C 11/1675 365/148 |

* cited by examiner

VOLTAGE CONTROL OF SOT-MRAM FOR DETERMINISTIC WRITING

TECHNICAL FIELD

The present disclosure relates to the technical field of magnetic random access memory based on voltage controlled of deterministic writing. More specifically, the present disclosure can provide a storage unit, a data writing method and a data reading method thereof, a memory, and an electronic device.

BACKGROUND

At present, a magnetic random access memory (MRAM) refers to a random access memory which can store data by changing a magnetization state, which has the advantages of good non-volatility, low power consumption and radiation resistance, etc. The most basic storage unit of a magnetic random access memory is a magnetic tunnel junction (MTJ), which induces flipping of a magnetic moment in the tunnel junction under the action of a current. However, a direction of this flipping is random. In order to make the flipping direction controllable, typically, an external magnetic field is applied to realize a directional flipping of the magnetic moment. However, the external magnetic field will inevitably increase the complexity of device, which results in a low density of semiconductor storage device, and can not meet the requirements of high integration of semiconductor device.

SUMMARY

In order to solve the problem that conventional SOT-MRAM cannot achieve the controllable flipping direction of magnetic moment with the high integration, the present disclosure provides a storage unit, a data writing method and a data reading method thereof, a memory, and an electronic device so as to achieve the object of obtaining an highly integrated device with a controllable flipping direction of magnetic moment, etc.

In order to achieve the above technical object, the present disclosure can provide a magnetic random access storage unit. The magnetic random access storage unit includes, without limitation, a semiconductor substrate, a first insulating medium layer, a ferroelectric thin film layer, a bottom electrode, a tunnel junction, a first metal interconnection portion, a second metal interconnection portion, a third metal interconnection portion and a fourth metal interconnection portion. The first insulating medium layer is formed on the semiconductor substrate, the ferroelectric thin film layer is disposed on the first insulating medium layer, the bottom electrode is formed on the ferroelectric thin film layer, and the tunnel junction is formed on the bottom electrode. The first metal interconnection portion is connected to a first end of the bottom electrode, and the third metal interconnection portion is connected to a second end of the bottom electrode; the first end and the second end are respectively located on both sides of the bottom electrode. The second metal interconnection portion is connected to the ferroelectric thin film layer, and the fourth metal interconnection portion is connected to the tunnel junction.

In order to achieve the above technical object, the present disclosure can also provide a magnetic random access memory, which may include, without limitation, the magnetic random access storage unit in any embodiment of the present disclosure.

In order to achieve the above technical object, the present disclosure can provide an electronic device, which may include, without limitation, the magnetic random access memory in any embodiment of the present disclosure.

In order to achieve the above technical object, the present disclosure can provide a data writing method for a magnetic random access storage unit. The data writing method for the magnetic random access storage unit may include, without limitation, the following steps.

applying a voltage is to a ferroelectric thin film layer and a bottom electrode thereon, so that the ferroelectric thin film layer is in a polarized state; stopping applying the voltage; and then applying a current into the bottom electrode to write data into a tunnel junction on the bottom electrode.

In order to achieve the above technical object, the present disclosure can provide a data reading method for a magnetic random access storage unit.

The data reading method for the magnetic random access storage unit may include, without limitation, at least one step as follows: applying a voltage to a ferroelectric thin film layer, a bottom electrode and a tunnel junction disposed in sequence in a vertical direction to read data from the tunnel junction.

The present disclosure has the following advantageous effects.

As compared with the conventional method of inducing flipping of the magnetic moment through an external magnetic field, the present disclosure can control a directional flipping of the magnetic moment in the tunnel junction based on the ferroelectric thin film layer provided. Based on the structural design of the storage unit, the present disclosure does not require an external magnetic field, and thus can fully meet the requirement of high integration of the device.

The magnetic random access storage unit or the magnetic random access memory provided by the present disclosure can be processed through mature semiconductor technologies, and as compared with the conventional processing of magnetic random access memory, the processing cost of the device is hardly increased. Therefore, the present disclosure can meet the requirements of industrialization and mass production, making it suitable for promotion and application.

The data reading and writing methods for the magnetic random access storage unit provided by the present disclosure are easy to implement, have strong anti-interference ability and high reliability. It can be seen that the present disclosure has the following advantages: the ways of controlling data writing and data reading are compilable, have low power consumption and a short response time, the storage performance is stable, and the integration is high, so that the miniaturization of SOT-MRAM storage devices can be specifically realized, which can meet the requirement of manufacturing high-density SOT-MRAM memory devices.

In the drawings:
100: semiconductor substrate;
201: first insulating medium layer; 202: second insulating medium layer;
300: ferroelectric thin film layer;
400: bottom electrode;
500: tunnel junction;
601: first metal interconnection portion; 602: second metal interconnection portion; 603: third metal interconnection portion; 604: fourth metal interconnection portion;
701: first interconnection metal layer; 702: second interconnection metal layer.

DETAILED DESCRIPTION

Hereinafter, embodiments of the present disclosure will be described with reference to the drawings. However, it should be understood that these descriptions are only exemplary, and are not intended to limit the scope of the present disclosure. In addition, in the following specification, descriptions of well-known structures and technologies are omitted so that the concept of the present disclosure will not be unnecessarily obscured.

Various schematic structural diagrams according to the embodiments of the present disclosure are shown in the drawings. These diagrams are not drawn to scale, some details are enlarged and some details may be omitted for clarity of expression. The shapes of various regions and layers shown in the drawings, as well as the relative sizes and positional relationships between them are only exemplary. In practice, there may be deviations due to manufacturing tolerances or technical limitations. Regions/layers with different shapes, sizes, and relative positions can be designed as needed.

In the context of the present disclosure, when a layer/element is referred to as being "on" another layer/element, the layer/element may be directly on said other layer/element, or there may be an intermediate layer/element therebetween. In addition, if a layer/element is located "on" another layer/element in a certain orientation, the layer/element may be located "under" said other layer/element when the orientation is reversed.

One or more embodiments of the present disclosure can provide a magnetic random access storage unit, which may specifically be a SOT-MRAM (spin orbit torque-magnetic random access memory) storage unit based on voltage control, that is, a spin orbit torque-magnetic random access storage unit.

Figure 1:
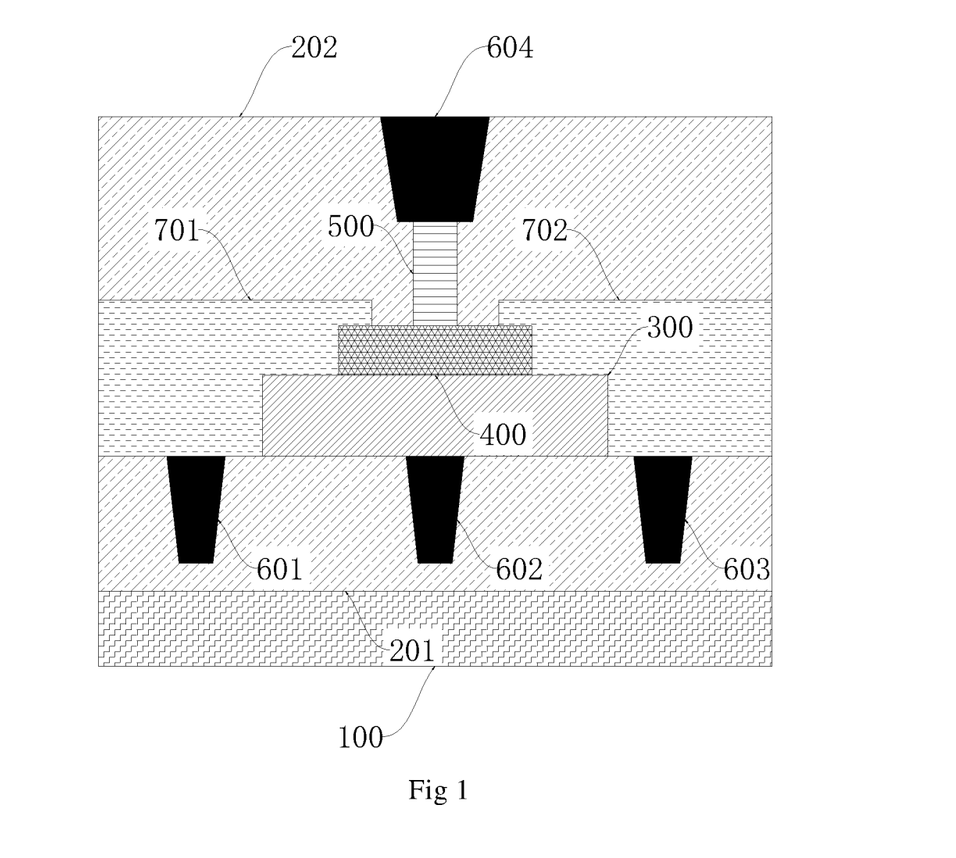
FIG. 1 shows a schematic structural diagram of a magnetic random access storage unit in some embodiments of the present disclosure.

As shown in FIG. 1, the magnetic random access storage unit in some embodiments of the present disclosure may include, without limitation, a semiconductor substrate 100, a first insulating medium layer 201, a second insulating medium layer 202, a ferroelectric thin film layer 300, a bottom electrode 400, a tunnel junction 500, a first metal interconnection portion 601, a second metal interconnection portion 602, a third metal interconnection portion 603, a fourth metal interconnection portion 604, a first interconnection metal layer 701, and a second interconnection metal layer 702 and so on.

The semiconductor substrate 100 of the present disclosure may be, for example, a bulk silicon substrate, a silicon-on-insulator (SOI) substrate, a germanium substrate, a germanium-on-insulator (GOI) substrate, a silicon-germanium substrate, a III-V group compound semiconductor substrate, or an epitaxial thin film substrate obtained by performing selective epitaxial growth (SEG), etc.

In the present disclosure, the ferroelectric thin film layer 300, the bottom electrode 400, and the tunnel junction 500 are disposed from bottom to top in sequence, forming a laminated structure as a whole. Specifically, in this embodiment, the first insulating medium layer 201 can be formed on the semiconductor substrate 100, and the ferroelectric thin film layer 300 can be disposed on the first insulating medium layer 201. The bottom electrode 400 is specifically formed on the ferroelectric thin film layer 300, and the tunnel junction 500 is specifically formed on the bottom electrode 400.

The ferroelectric thin film layer 300 can be, for example, PZT (plumbum zirconate titanate) or HrZrO. The present disclosure can be implemented in CMOS (complementary metal oxide semiconductor) process by thin film growing means such as PVD (physical vapor deposition), ALD (atomic layer deposition), etc. The ferroelectric thin film layer 300 may for example have a square shape or other shapes. The structure of the SOT tunnel junction can be grown on the ferroelectric thin film when processing the device of the present disclosure. In addition, the tunnel junction 500 can specifically include a fixed magnetic layer, a tunnel insulating layer, a free magnetic layer, an upper electrode layer, etc., which are stacked in sequence in a longitudinal direction, and a detail description thereof will be omitted in the present disclosure.

The first metal interconnection portion 601 is connected to a first end of the bottom electrode 400, and the second metal interconnection portion 602 is connected to the ferroelectric thin film layer 300. The third metal interconnection portion 603 is connected to a second end of the bottom electrode 400. The second end of the bottom electrode 400 and the first end of the bottom electrode 400 are respectively located on both sides of the bottom electrode 400, and the first end and the second end can be respectively located on left and right sides of the bottom electrode 400. The fourth metal interconnection portion 604 is connected to the tunnel junction 500. The first metal interconnection portion 601, the second metal interconnection portion 602, the third metal interconnection portion 603, and the fourth metal interconnection portion 604 can be formed by filling vias with metal and then planarizing. The metal material can be, for example, tungsten, copper or gold, etc.

The first interconnection metal layer 701 is formed on the first insulating medium layer 201, the first metal interconnection portion 601 is indirectly connected to the first end of the bottom electrode 400, and the first interconnection metal layer 701 is used for the connection of the first metal interconnection portion 601 to the first end of the bottom electrode 400. The second interconnection metal layer 702 is not connected to the first interconnection metal layer 701. The second interconnection metal layer 702 is formed on the first insulating medium layer 201, the third metal interconnection portion 603 is indirectly connected to the second end of the bottom electrode 400, and the second interconnection metal layer 702 is specifically used for the connection of the third metal interconnection portion 603 to the second end of the bottom electrode 400. The second insulating medium layer 202 can be formed on the first interconnection metal layer 701 and the second interconnection metal layer 702, and the tunnel junction 500 is disposed in the second insulating medium layer 202. The bottom electrode 400 is specifically a SOT (spin orbit torque) bottom electrode. The first interconnection metal layer 701 and the second interconnection metal layer 702 may also be formed of conductive materials such as metal.

As shown in FIG. 1, more specifically, the magnetic random access storage unit of the present disclosure further includes a first via (via 1), a second via (via 2), a third via (via 3), and a fourth via (via 4). The first via is formed in the first insulating medium layer 201, and the first metal interconnection portion 601 is formed in the first via. The second via is formed in the first insulating medium layer 201, and the second metal interconnection portion 602 is formed in the second via. The third via is formed in the first insulating medium layer 201, and the third metal interconnection portion 603 is formed in the third via. The fourth via is disposed on the tunnel junction 500 and formed in the second insulating medium layer 202; the fourth metal interconnection portion 604 is formed in the fourth via. Therefore, in this embodiment, the first metal interconnection portion 601, the second metal interconnection portion 602, and the third metal interconnection portion 603 are disposed under the ferroelectric thin film layer 300, and the fourth metal interconnection portion 604 is disposed above the ferroelectric thin film layer 300.

Figure 2:
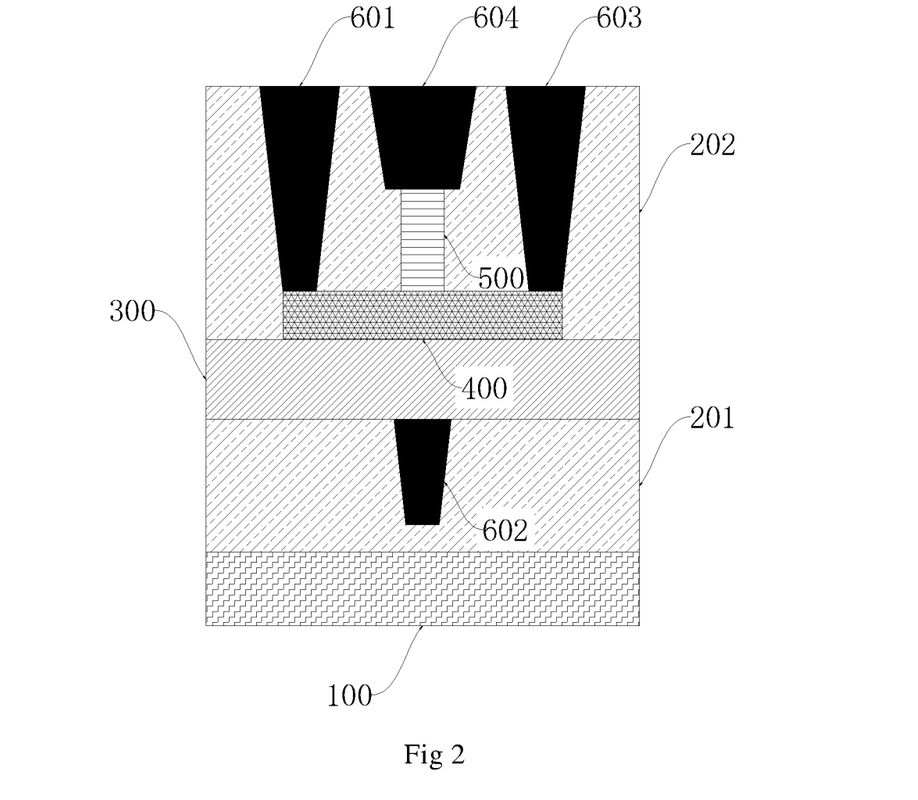
FIG. 2 shows a schematic structural diagram of a magnetic random access storage unit in some other embodiments of the present disclosure.

As shown in FIG. 2, some other embodiments of the present disclosure can provide a magnetic random access storage unit that is easier to process, and the structure of device is simpler than the structure shown in FIG. 1. The magnetic random access storage unit includes, without limitation, a semiconductor substrate 100, a first insulating medium layer 201, a ferroelectric thin film layer 300, a bottom electrode 400, a tunnel junction 500, a first metal interconnection portion 601, a second metal interconnection portion 602, a third metal interconnection portion 603, a fourth metal interconnection portion 604, a second insulating medium layer 202, and so on.

The first insulating medium layer 201 is formed on the semiconductor substrate 100, and the ferroelectric thin film layer 300 can be disposed on the first insulating medium layer 201. The bottom electrode 400 is formed on the ferroelectric thin film layer 300, and the tunnel junction 500 is formed on the bottom electrode 400. The second insulating medium layer 202 is also formed on the ferroelectric thin film layer 300. The first metal interconnection portion 601 is connected to a first end of the bottom electrode 400, and the second metal interconnection portion 602 is connected to the ferroelectric thin film layer 300. The third metal interconnection portion 603 is connected to a second end of the bottom electrode 400. The second end of the bottom electrode 400 and the first end of the bottom electrode 400 are respectively located on both sides of the bottom electrode 400, and the first end and the second end may each be located on left and right sides of an upper part of the bottom electrode 400. The fourth metal interconnection portion 604 is connected to the tunnel junction 500.

As shown in FIG. 2, the magnetic random access storage unit in some other embodiments of the present disclosure may also include a first via (via 1), a second via (via 2), a third via (via 3), and a fourth via (via 4). The first via is formed in the second insulating medium layer 202, and the first metal interconnection portion 601 is formed in the first via. The second via is formed in the first insulating medium layer 201, and the second metal interconnection portion 602 is formed in the second via. The third via is formed in the second insulating medium layer 202, and the third metal interconnection portion 603 is formed in the third via. The fourth via is disposed on the tunnel junction 500 and formed in the second insulating medium layer 202; the fourth metal interconnection portion is formed in the fourth via. Therefore, in this embodiment, the second metal interconnection portion 602 is disposed under the ferroelectric thin film layer 300, and the first metal interconnection portion 601, the third metal interconnection portion 603 and the fourth metal interconnection portion 604 are disposed above the ferroelectric thin film layer 300.

It should be understood that specific parameters such as the shape and thickness of each structural material layer included in the magnetic random access storage unit in one or more embodiments of the present disclosure may be reasonably set according to actual requirements, application scenes and use environments of the magnetic random access memory product, and a detailed description in this regard will be omitted in the present disclosure.

Based on the same technical concept as the structure of the magnetic random access storage unit of the present disclosure, the present disclosure can also provide a data writing method for a magnetic random access storage unit. The data writing method includes, without limitation, the following one or more steps. Regarding the structure of the product in FIG. 1 or FIG. 2, a repeated description will not be given herein.

Figure 3:
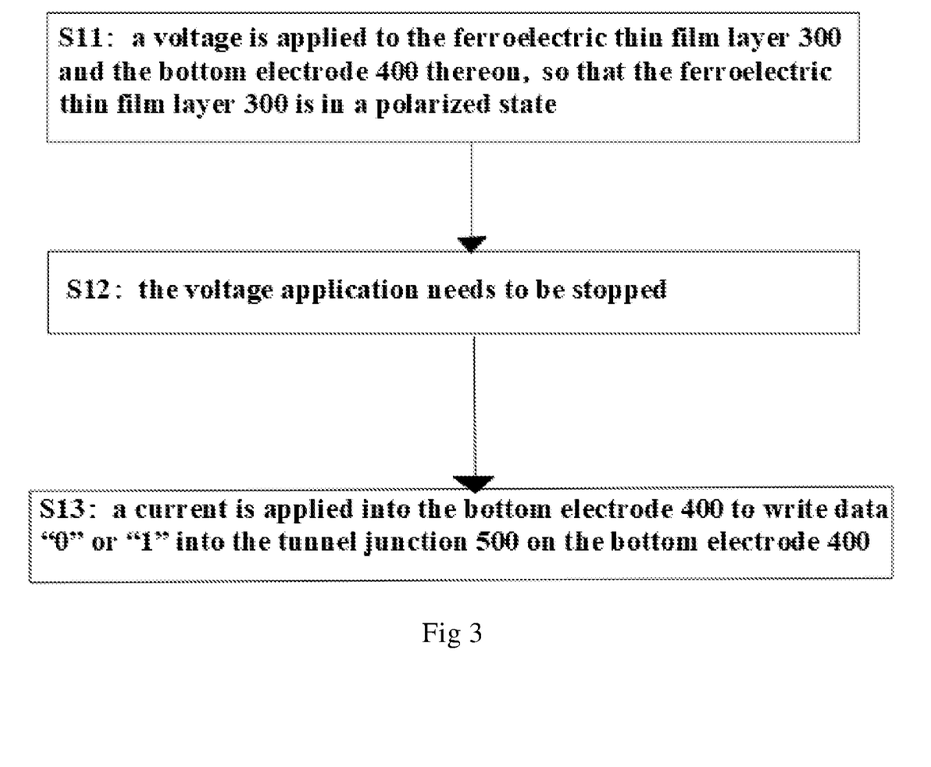
FIG. 3 shows a data writing method for a magnetic random access storage unit.

As shown in FIG. 3, in S11, firstly, a voltage is applied to the ferroelectric thin film layer 300 and the bottom electrode 400 thereon, so that the ferroelectric thin film layer 300 is in a polarized state (that is, the ferroelectric thin film layer 300 is magnetized). Then, the present disclosure uses the ferroelectric thin film layer 300 in the polarized state to guide a directional flipping of the magnetic moment in the tunnel junction 500. Specifically, as shown in FIG. 1 or 2, the present disclosure includes two ways of applying the voltage: (1) applying a positive voltage or a negative voltage between the first metal interconnection portion 601 and the second metal interconnection portion 602; or (2) applying a positive voltage or a negative voltage between the third metal interconnection portion 603 and the second metal interconnection portion 602.

In S12: after the ferroelectric thin film layer 300 is in the magnetized state, the voltage application needs to be stopped.

In S13: a current is applied into the bottom electrode 400 to write data "0" or "1" into the tunnel junction 500 on the bottom electrode 400. As shown in FIG. 1 or 2, in the present disclosure, specifically, a positive current or a negative current can be applied between the first metal interconnection portion 601 and the third metal interconnection portion 603, so as to realize the current application into the bottom electrode 400. It should be understood that the current used for writing in the present disclosure does not pass through the tunnel junction 500. Therefore, it can be seen that the memory based on the present disclosure has extremely high durability and is more suitable for applications in storage-computation integrated devices.

Specifically, in some embodiments of the present disclosure, applying the voltage to the ferroelectric thin film layer 300 and the bottom electrode 400 thereon may include: applying a vertical voltage to the ferroelectric thin film layer 300 and the bottom electrode 400 disposed in sequence in a vertical direction, so that an electric field can be better established in the ferroelectric thin film layer 300, and the spin Hall effect of the SOT bottom electrode 400 can be more sensitively adjusted, so as to realize a directional magnetization and flipping of the magnetic moment of the tunnel junction 500.

More specifically, in the present disclosure, applying the current to the bottom electrode 400 includes: applying a horizontal current between the first end of the bottom electrode 400 and the second end of the bottom electrode 400.

With reference to FIG. 1 or FIG. 2, the process of writing data "1" or "0" to the magnetic random access storage unit according to the present disclosure will be described in more detail below.

Writing data "1": A positive voltage is applied from the first metal interconnection portion 601 (or the third metal interconnection portion 603) to the second metal interconnection portion 602 to vertically polarize the ferroelectric thin film layer 300. The applied positive voltage is removed, and a positive current flows from the first metal interconnection portion 601 to the third metal interconnection portion 603.

Writing data "0": A negative voltage is applied from the first metal interconnection portion 601 (or the third metal interconnection portion 603) to the second metal interconnection portion 602 to vertically polarize the ferroelectric thin film layer 300. The applied negative voltage is removed, and a positive current flows from the first metal interconnection portion 601 to the third metal interconnection portion 603.

Similarly, the present disclosure can also write data "1" or "0" to the magnetic random access storage unit in the following manner.

Writing data "1": A negative voltage is applied from the first metal interconnection portion 601 (or the third metal interconnection portion 603) to the second metal interconnection portion 602 to vertically polarize the ferroelectric thin film layer 300. The applied negative voltage is removed, and a negative current flows from the first metal interconnection portion 601 to the third metal interconnection portion 603.

Writing data "0": A positive voltage is applied from the first metal interconnection portion 601 (or the third metal interconnection portion 603) to the second metal interconnection portion 602 to vertically polarize the ferroelectric thin film layer 300. The applied positive voltage is removed, and a negative current flows from the first metal interconnection portion 601 to the third metal interconnection portion 603.

Based on the above-mentioned process of writing data "0" or "1", it can be determined that the present disclosure can choose to apply a positive voltage or a negative voltage according to whether it is the data "1" or the data "0" is to be written, that is, the writing of SOT-MRAM is regulated by changing the positive or negative polarization of the voltage; and the present disclosure can also choose to apply a positive current or a negative current according to whether it is the data "1" or the data "0" is to be written, that is, the writing of SOT-MRAM is regulated by changing the direction of the current. Or it can be understood that the present disclosure can choose the positive or negative polarization of the applied voltage and change the direction of the current according to whether it is the data "1" or the data "0" is to be written.

Based on the same technical concept as the structure of the magnetic random access storage unit of the present disclosure, the present disclosure can also provide a data reading method for a magnetic random access storage unit. The data reading method may include, without limitation, the following at least one step. Regarding the structure of the product in FIG. 1 or FIG. 2, a repeated description will not be given herein.

A voltage is applied to the ferroelectric thin film layer 300, the bottom electrode 400, and the tunnel junction 500 that are disposed in sequence in the vertical direction to read data from the tunnel junction 500.

As shown in FIG. 1 or 2, the present disclosure can specifically apply a current between the first metal interconnection portion 601 and the fourth metal interconnection portion 604, so that the data currently stored in the magnetic random access storage unit ("0" or "1") can be read.

It should be understood that the voltage, current and other parameters specifically used in one or more embodiments of the present disclosure can be set reasonably according to the actual requirements of sizes and materials of the semiconductor devices and the like, as long as the technical object of the solutions of the present disclosure can be realized, and a detailed description in this regard will be omitted herein.

The present disclosure can also provide a magnetic random access memory, which may include the magnetic random access storage unit in any embodiment of the present disclosure. The magnetic random access memory of the present disclosure is specifically a spin orbit torque-magnetic random access memory. The magnetic random access memory may include, for example, a plurality of storage arrays arranged in a matrix structure, in which each magnetic random access storage unit can be controlled by one or more transistors to complete data writing and reading of the magnetic random access storage unit.

The present disclosure can also provide an electronic device, which includes the magnetic random access memory or the magnetic random access storage unit in any embodiment of the present disclosure.

It should be understood that the electronic devices involved in the present disclosure may include, without limitation, smart phones, computers, tablet computers, wearable smart devices, artificial intelligence devices, mobile power supplies, and the like.

In the above description, the technical details such as patterning and etching of each layer is not described in detail. However, it should be understood by those skilled in the art that various technical means can be used to form layers and regions of a desired shape, etc. In addition, in order to form the same structure, those skilled in the art can also design a method that is not completely the same as the method described above. In addition, although individual embodiments have been described above, this does not mean that the measures in the individual embodiments cannot be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art can make various substitutions and modifications, and these substitutions and modifications should fall within the scope of the present disclosure.

The invention claimed is:

1. A magnetic random access storage unit, comprising:
   a semiconductor substrate;
   a first insulating medium layer formed on the semiconductor substrate;
   a ferroelectric thin film layer disposed on the first insulating medium layer;
   a bottom electrode formed on the ferroelectric thin film layer;
   a tunnel junction formed on the bottom electrode;
   a first metal interconnection portion connected to a first end of the bottom electrode;
   a second metal interconnection portion connected to the ferroelectric thin film layer;

a third metal interconnection portion connected to a second end of the bottom electrode, the second end and the first end being respectively located on both sides of the bottom electrode;

a fourth metal interconnection portion connected to the tunnel junction;

a first interconnection metal layer formed on the first insulating medium layer; the first interconnection metal layer being used for the connection of the first metal interconnection portion to the first end of the bottom electrode;

a second interconnection metal layer formed on the first insulating medium layer, the second interconnection metal layer being used for the connection of the third metal interconnection portion to the second end of the bottom electrode;

a second insulating medium layer formed on the first interconnection metal layer and the second interconnection metal layer, the tunnel junction being disposed in the second insulating medium layer; and a fourth via disposed on the tunnel junction and formed in the second insulating medium layer, the fourth metal interconnection portion being formed in the fourth via.

2. The magnetic random access storage unit according to claim 1, further comprising:

a first via formed in the first insulating medium layer; the first metal interconnection portion being formed in the first via;

a second via formed in the first insulating medium layer; the second metal interconnection portion being formed in the second via; and a third via formed in the first insulating medium layer, the third metal interconnection portion being formed in the third via.

3. A magnetic random access memory, comprising the magnetic random access storage unit according to claim 1.

4. An electronic device, comprising the magnetic random access memory according to claim 3.

5. A data writing method for a magnetic random access storage unit, comprising:

applying a voltage to a ferroelectric thin film layer and a bottom electrode thereon, so that the ferroelectric thin film layer is in a polarized state;

stopping applying the voltage; and applying a current into the bottom electrode to write data into a tunnel junction on the bottom electrode;

wherein the data writing method for the magnetic random access storage unit is accomplished through the magnetic random access storage unit according to claim 1.

6. The data writing method for the magnetic random access storage unit according to claim 5, wherein the applying the voltage to the ferroelectric thin film layer and the bottom electrode thereon comprises:

applying a vertical voltage to the ferroelectric thin film layer and the bottom electrode disposed in sequence in a vertical direction.

7. The data writing method for the magnetic random access storage unit according to claim 5, wherein the applying the voltage to the ferroelectric thin film layer and the bottom electrode thereon comprises:

applying a positive voltage or a negative voltage according to the data to be written.

8. The data writing method for the magnetic random access storage unit according to claim 5, wherein the applying the current into the bottom electrode comprises:

applying a horizontal current between a first end of the bottom electrode and a second end of the bottom electrode.

9. The data writing method for the magnetic random access storage unit according to claim 5, wherein the applying the current into the bottom electrode comprises:

applying a positive current or a negative current according to the data to be written.

10. A data reading method for a magnetic random access storage unit, comprising:

applying a voltage to a ferroelectric thin film layer, a bottom electrode, and a tunnel junction that are disposed in sequence in a vertical direction to read data from the tunnel junction;

wherein the data reading method for a magnetic random access storage unit is accomplished through the magnetic random access storage unit according to claim 1.

11. A magnetic random access storage unit, comprising:
a semiconductor substrate;
a first insulating medium layer formed on the semiconductor substrate;
a ferroelectric thin film layer disposed on the first insulating medium layer;
a bottom electrode formed on the ferroelectric thin film layer;
a tunnel junction formed on the bottom electrode;
a first metal interconnection portion connected to a first end of the bottom electrode;
a second metal interconnection portion connected to the ferroelectric thin film layer;
a third metal interconnection portion connected to a second end of the bottom electrode, the second end and the first end being respectively located on both sides of the bottom electrode;
a fourth metal interconnection portion connected to the tunnel junction;
a second insulating medium layer formed on the ferroelectric thin film layer;
a first via formed in the second insulating medium layer, the first metal interconnection portion being formed in the first via;
a second via formed in the first insulating medium layer, the second metal interconnection portion being formed in the second via;
a third via formed in the second insulating medium layer, the third metal interconnection portion being formed in the third via; and
a fourth via disposed on the tunnel junction and formed in the second insulating medium layer, the fourth metal interconnection portion being formed in the fourth via.

12. A magnetic random access memory, comprising the magnetic random access storage unit according to claim 11.

13. An electronic device, comprising the magnetic random access memory according to claim 12.

14. A data writing method for a magnetic random access storage unit, comprising:

applying a voltage to a ferroelectric thin film layer and a bottom electrode thereon, so that the ferroelectric thin film layer is in a polarized state;

stopping applying the voltage; and applying a current into the bottom electrode to write data into a tunnel junction on the bottom electrode;

wherein the data writing method for the magnetic random access storage unit is accomplished through the magnetic random access storage unit according to claim 11.

15. The data writing method for the magnetic random access storage unit according to claim 14, wherein the applying the voltage to the ferroelectric thin film layer and the bottom electrode thereon comprises:
   applying a vertical voltage to the ferroelectric thin film layer and the bottom electrode disposed in sequence in a vertical direction.

16. The data writing method for the magnetic random access storage unit according to claim 14, wherein the applying the voltage to the ferroelectric thin film layer and the bottom electrode thereon comprises:
   applying a positive voltage or a negative voltage according to the data to be written.

17. The data writing method for the magnetic random access storage unit according to claim 14, wherein the applying the current into the bottom electrode comprises:
   applying a horizontal current between a first end of the bottom electrode and a second end of the bottom electrode.

18. The data writing method for the magnetic random access storage unit according to claim 14, wherein the applying the current into the bottom electrode comprises:
   applying a positive current or a negative current according to the data to be written.

19. A data reading method for a magnetic random access storage unit, comprising:
   applying a voltage to a ferroelectric thin film layer, a bottom electrode, and a tunnel junction that are disposed in sequence in a vertical direction to read data from the tunnel junction;
   wherein the data reading method for a magnetic random access storage unit is accomplished through the magnetic random access storage unit according to claim 11.

* * * * *